Figure 1:
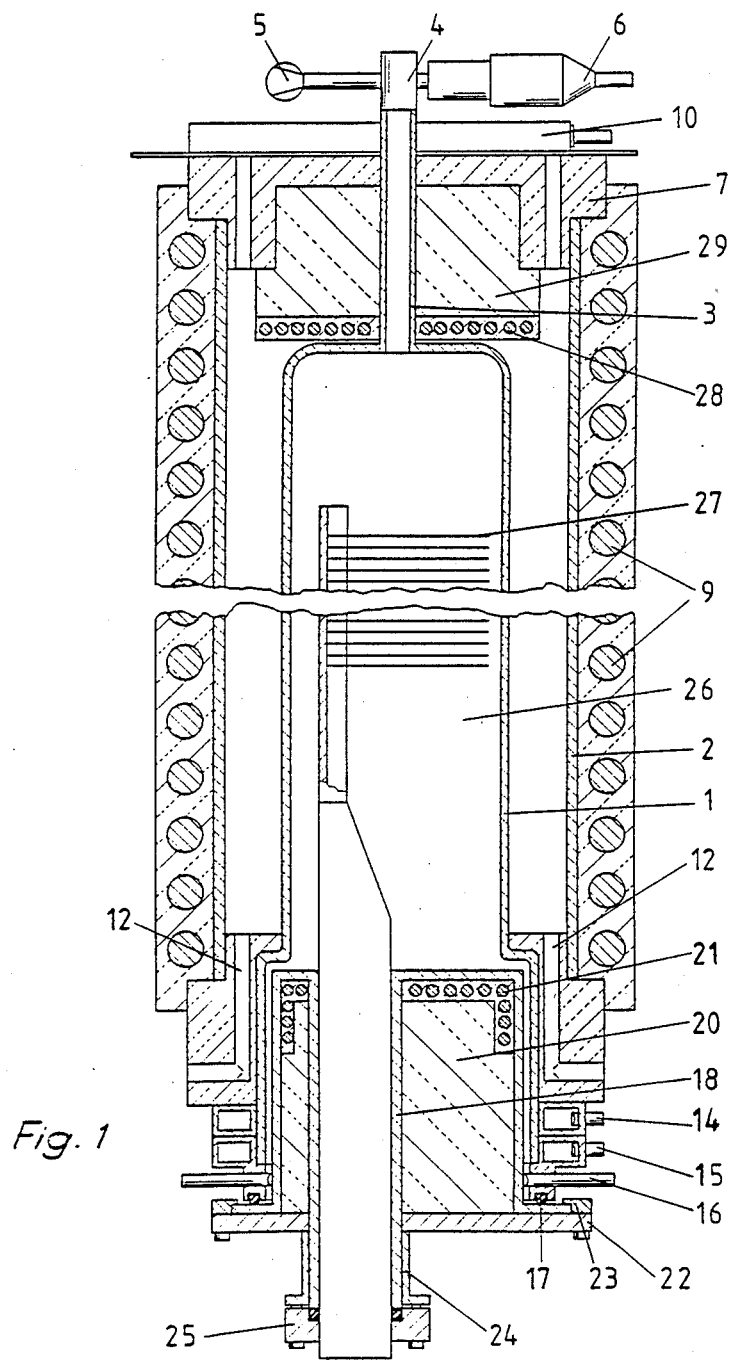

United States Patent [19]

Söhlbrand

[11] Patent Number: 4,943,234
[45] Date of Patent: Jul. 24, 1990

[54] PROCEDURE AND EQUIPMENT FOR THE THERMAL TREATMENT OF SEMICONDUCTOR MATERIALS

[76] Inventor: Heinrich Söhlbrand, Wirtsbauernstrasse 26,, D 8021 Neuried bei Mëchen, Fed. Rep. of Germany

[21] Appl. No.: 314,460
[22] Filed: Feb. 23, 1989
[51] Int. Cl.$^5$ ............................................. F27B 9/04
[52] U.S. Cl. .................................. 432/152; 432/241; 432/253
[58] Field of Search ................. 432/241.11, 5, 6, 253, 432/152

[56] References Cited

U.S. PATENT DOCUMENTS 3,737,282 6/1973 Hearn et al. ........................ 432/253
3,811,825 5/1974 Enderlin .............................. 432/253
4,412,812 11/1983 Sadowski et al. ..................... 432/11

Primary Examiner—Henry C. Yuen
Attorney, Agent, or Firm—Kane,Dalsimer, Sullivan,Kurucz, Levy,Eisele and Richard

[57] ABSTRACT

The invention proposes a process and equipment for the thermal treatment of semiconductor materials which contains an isothermal, all-round heated process tube in a so-called "closed-tube" process using a compact construction of the furnace, whereby a defined process gas atmosphere is present in the process chamber from the very start of the process and a reverse diffusion is prevented. A double-tube system is used here with an adjustable interspace rinsing, i.e. the use of the so-called "rapid cassette" in cold blowing. Applications for the invention are in particular the oxidation, diffusion, deposition and tempering of semiconductor discs.

11 Claims, 4 Drawing Sheets

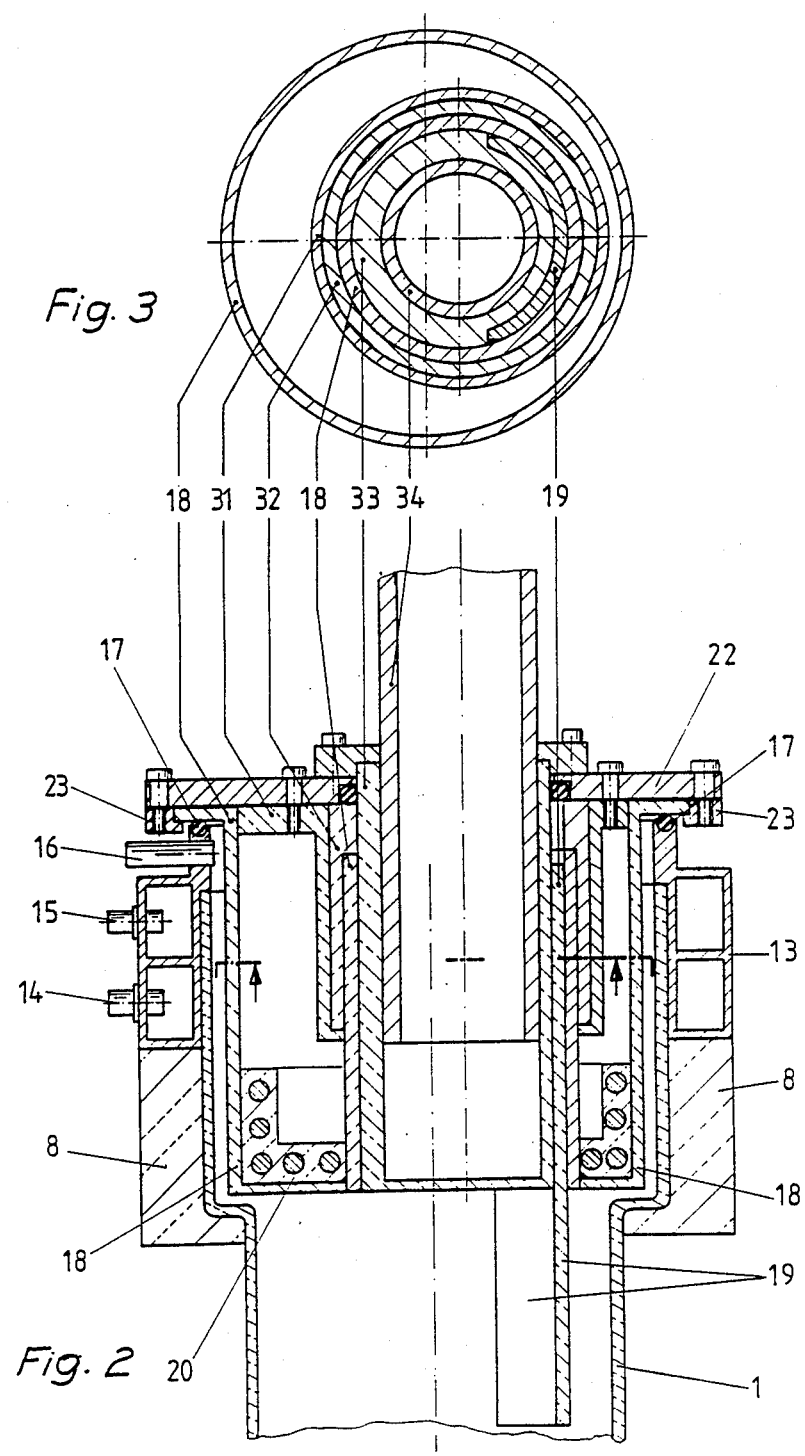

PROCEDURE AND EQUIPMENT FOR THE THERMAL TREATMENT OF SEMICONDUCTOR MATERIALS

The invention relates to a process and a piece of equipment for the thermal treatment of semiconductor materials, in particular for low, middle and high temperature treatment by means of a diffusion furnace containing a double-walled process tube, open on the loading side, with a liquid rinsing system provided in the annulus remaining between the tube walls, a cantilever construction for loading the semiconductor discs to be treated into the process tube and a process gas feeder at the rear end of the process tube with disposal of this gas on the loading side.

Such processes and equipment for the thermal treatment of semiconductor materials, generally called diffusion furnaces, are well known. The diffusion furnaces, mostly constructed as horizontal diffusion furnaces, serve for the oxidation, diffusion, deposition and tempering of discs of semiconductor materials. The semiconductor discs are hereby placed on special installations, called cantilevers, and inserted into a quartz tube or a tube of Si or SiC, which is called the process tube and forms the inner wall of the diffusion furnace, and subjected to temperature treatment in this. The cantilevers with the semiconductor discs perform a lateral movement coaxial to the tube during which the semiconductor discs which are to be inserted into the process tube never actually touch the tube itself.

After insertion into the process tube the semiconductor discs are subjected to high temperatures from the very start, which can already be the actual process temperatures or the holding temperature with values between 700 and 800° C.

These known diffusion furnaces do, however, display certain disadvantages. The main reason for this is the lack of adjustment of the furnace itself, i.e. the equipment, to the process applied. Thus the semiconductor discs are heated quickly and with no control to this temperature. The semiconductor discs are then, depending on the respective technique, subjected to the actual desired process atmosphere by means of displacement rinsing, whereby the process tube can never be completely, i.e. 100% sealed. The consequence of this is that in addition to an incomplete displacement rinsing, reverse diffusion also takes place and thus the process gas atmosphere is always undefined with respect to location, composition and time. A reproducibility of the process carried out is thus impossible, which leads to serious technological disadvantages. This is then reflected in a lack of functionality, yield and operational reliability of semiconductor discs treated in this manner. A further disadvantage of these known diffusion furnaces is that only one circular heating element is provided around the process tube, which leads to uncontrolled temperature conditions in the process chamber.

Tests have already been carried out to eliminate these disadvantages whereby inert gas sluices have been installed at the open end of the process tube. However, this measure led to only unsatisfactory improvements in the process.

Similarly the subject of DE C1 35 39 981 brings no improvement since the exchange of the process gas would take far too long to enable an economical process to be carried out. This would entail standstill times o& up to many days before a new process could be instigated.

It is here that the invention is planned to provide a remedy. The invention as characterized in the claims solves the problem of providing a diffusion furnace which is adapted to the process and in whose reaction chamber isothermal conditions are present, no energy is lost through dissipation, every kind of heavy metal contamination of the semiconductor discs to be processed can be avoided, a clearly defined process gas atmosphere is already given at temperatures below 400° C. and process temperatures can be applied over a wide range and in which semiconductor discs of mono or polycrystalline silicium or mono or polycrystalline silicium on random base materials as well as other semiconductor materials can be treated.

A number of advantages are gained through the invention. Thus, the process tube can be completely sealed, avoiding a dissipation of the energy, and furthermore a possible heavy metal contamination has been prevented through the installation of a double-wall tube with permanent inert gas rinsing. Similarly a clearly defined process gas atmosphere is achieved even at temperatures below 400° C. through the use of a "soft-pump-down-step" with absolute tight sealing of the process tube, and it is possible to feed in the process gas on the loading side with simultaneous preheating through a moveable heating element integrated in the oantilever. A further advantage is that the process tube is widened at its open end and is enclosed by the vestibule block in such a way that the dissipation of energy is eliminated, whereby working temperatures can be achieved in a range from approx. room temperature to 1300° C.

The invention is explained in more detail in the following by means of the design types shown in the illustrations.

Figure 4:
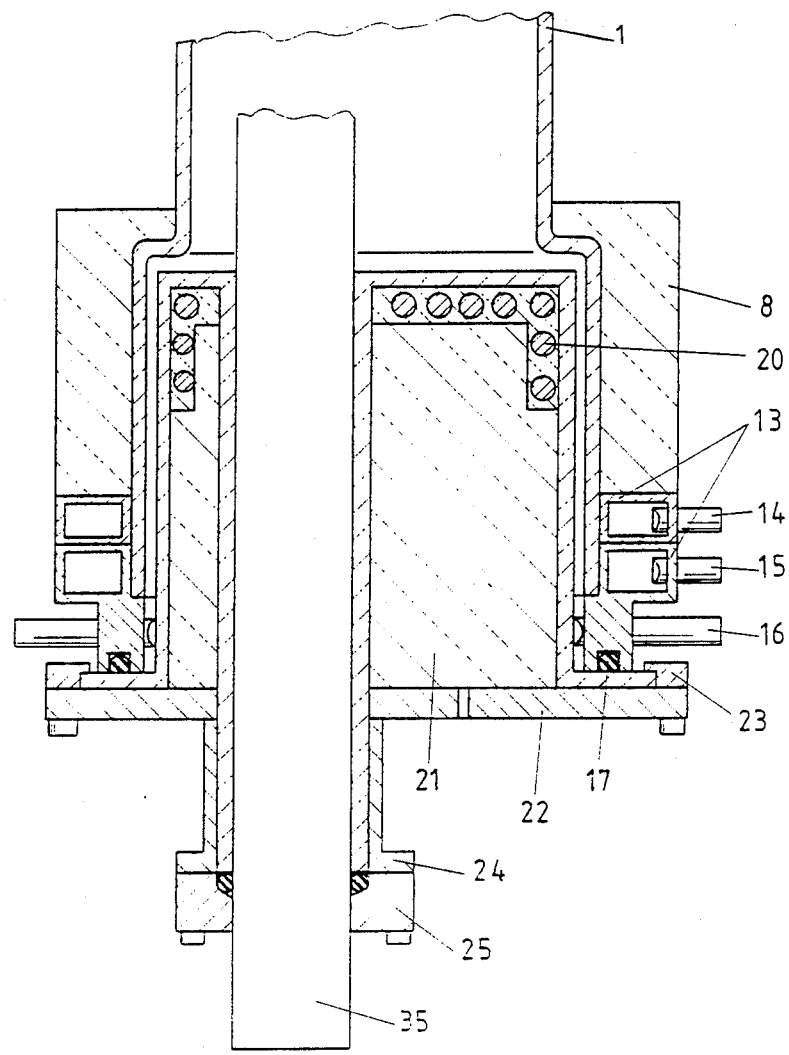

These show:

FIG. 1 a longitudinal section through the equipment according to the invention,

FIG. 2 a section through one design variant of the cantilever,

FIG. 3 a section through FIG. 2,

FIG. 4 a further design variant of FIG. 2, and

Figure 5:
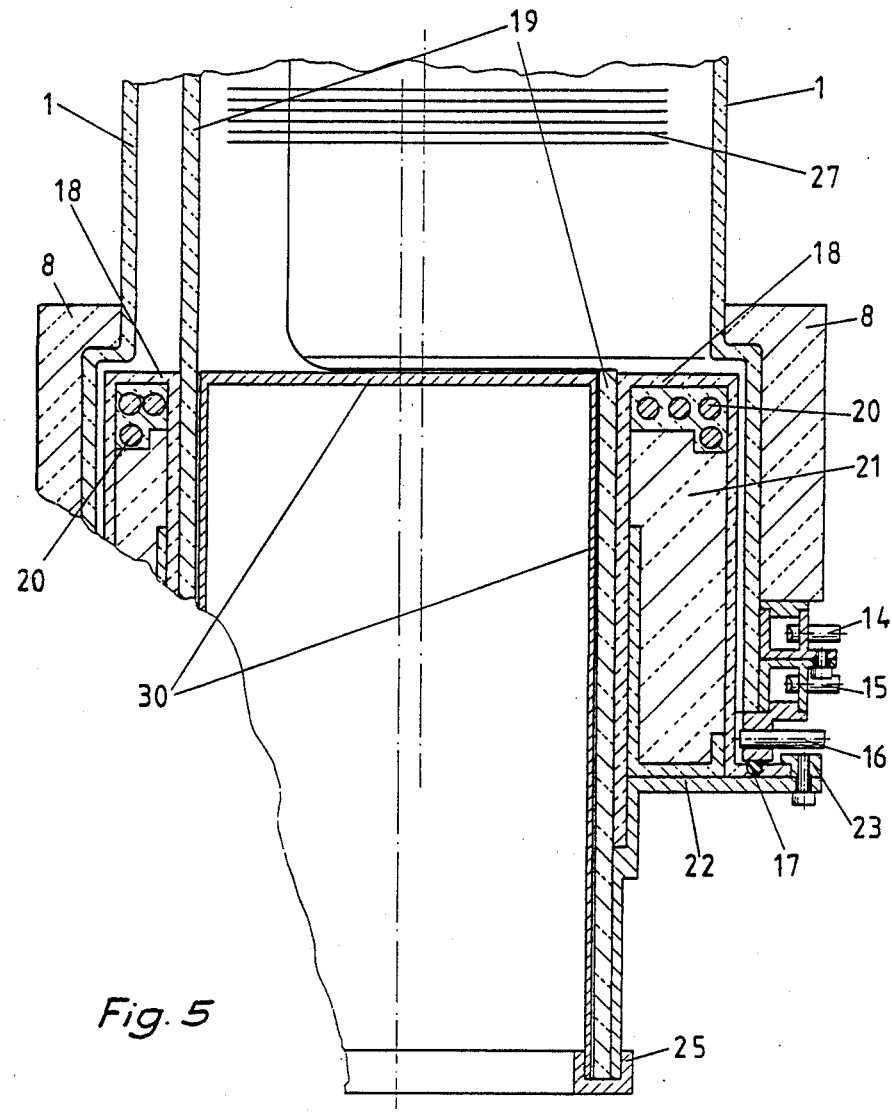

FIG. 5 a design variant of FIG. 1.

The equipment shown in section in FIG. 1 is a so-called diffusion furnace for the thermal treatment of semioonduolor discs. The diffusion furnace mainly consists of a process tube 1, which is at the same time the inner wall of the diffusion furnace, and an external tube 2, which is fixed in its position relative to the process tube 1 and the heating cassette 9 by means of the vestibule blocks 7 and B. This process tube 1 is widened at its open, loading side (to the right in the illustration), whereas it narrows at its left end, in the direction of the gas outlet pipe The gas disposal system for the process tube i is either by means of a 3-way valve 4 and a pumping station 5 or a special exhaust system with N-sluice 6. Both tubes 1 and 2 thus form a fixed double-wall tube system. The inner and outer tube is preferably of quartz, Si, SiC, Al 0, polycrystalline Si or another material suitable for semiconductors which has an inherent stability up to 1300° C., whereby Al 0 is not so suitable for the inner tube. Since there are no fixed, i.e. welded connections between the two tubes i and 2 it is not necessary to produce both tubes of the same material.

The vestibule block 7 is axially sprung so as to be able to follow the movements of the process tube 1 caused by the temperature, whereas the vestibule block 8 is fixed rigidly. The cantilever arrangement 18-25 is moved axially for insertion and removal. The vestibule blocks are preferably manufactured of graphite with a BM-coating. In this way both an absolute resistance to temperature stress as well as an absolute clean-room suitability are achieved.

The inert gas feeder 10 is connected to a crown of inlet nozzles 11 in the vestibule block 7 through which the space between tubes 1 and 2 is continually, i.e. during the process phase and in stand-by operation, rinsed. In this way it is possible to avoid contamination, in particular through heavy metals, from the heating cassette area. The rinse gases leave the tube system through a further crown of outlet nozzles 12 in the vestibule block 8.

At the same time the vestibule block 8 also serves as receptor and support for the process tube 1 which is widened at its open end. Through this measure it is possible to almost completely prevent heat dissipation on the loading side of the diffusion furnace.

A cooling jacket system 13 is flush to the vestibule block 8 and forms the actual tube end. This cooling jacket system contains an air cooling system 14 and a water cooling system 15 as well as the process gas feeder 16. The cooling jacket system 13 is sealed vacuum-tight to the cantilever system 18-25 and tube 1 by means of a conical nipple 17 provided the cantilever's insert position has been attained.

The process gases, which leave the process gas feeder laterally, are set into rotation and flow into the actual reaction chamber 26 through the circular groove between the widened end of the process tube 1 and the quartz connection piece 18 of the cantilever system 18-25, whereby the gases are already preheated by the heating element 20.

The cantilever system 18-25 is mounted in the usual manner on a moveable cradle, not shown in the illustration, with mounting platform, and consists, as shown in FIG. 1, of a SiC paddle 19, which also carries the semiconductor discs 27 to be treated on an LP-carrier in the usual manner, not shown, and which furthermore bears a special quartz connection piece with flange 18 on account of its high thermal and mechanical stability, in which is installed an adjustable heating element 20 which can be moved with the rest of the system and which fills the cross-section on the loading side in the manner shown. The remaining hollow space is filled out with quartz wool 21. The connection piece 18 is fixed with a retaining ring by means of a metal or ceramic plate 22 To counter a possible thermal overloading the plate 22 is connected to 0-ring 25 by a form-fit connection piece 24 with a gasket and is at the same time fixed in its position on the SiC paddle 19.

An additional adjustable heating element 28 is permanently fixed in a quartz tube connection piece in the rear vestibule block 7, whereby the remaining hollow space is filled out with quartz wool. Isothermic conditions on the gas outlet side are achieved by means of this heating element 28.

The cantilever system in accordance with FIG. 1 as well as its design variants in accordance with FIGS. 2-5 consists of form-fit parts of different materials which can be plugged together to form an operative cantilever system. Preferential materials for the individual parts of the cantilever system are quartz, polycrystalline silicium, SiC; homogenous mixtures of quartz, teflon or polyamides; homogenous mixtures of quartz and Al 0, BN, Si N, polycrystalline Si, SiC; or homogenous mixtures of teflon or polyamides with Al 0, Si N, polycrystalline Si, SiC or similar.

The design variant of the cantilever system in accordance with FIG. 2 and FIG. 8 is equipped with a plug-in type paddle 33,34 which can easily be replaced. Such a paddle is particularly advantageous if processes are to be carried out which are characterized by a high material stress, such as for example deposition processes, diffusions etc., whereby the simple removal of the paddle is followed by the insertion of a new paddle. This measure means that the diffusion furnace is once again ready for operation in a very short space of time, approx. ½ a minute.

The design variant in accordance with FIG. 4 shows a cantilever system for special applications, such as precipitation processes or similar, whereby the paddle 35 has a particularly low mass.

The design variant in accordance with FIG. 5 is particularly suitable for low temperature processes, plasma deposition, tempering after implantations, etc.. The paddle 36 is welded in place here.

The diffusion furnace shown in accordance with the invention is also suitable for retrofitting in already existing diffusion furnaces of an older make with no adaptation.

The process cycle is explained through the example of a socalled "gate oxidation", whereby it should be stressed that gate oxidation is only one of the many possible processes which can be carried out with the equipment.

Before starting the actual process cycle the temperature of the heating cassette 9 and the heating element 28 are brought up to approx. 300° C. and the temperature of the heating element 20 to room temperature, whilst the inert gas rinsing system, consisting of the inert gas feeder 10 with crown of inlet nozzles 11 and the outlet nozzles 12 is set to a high rate o& flow to achieve an additional rapid cooling of the reaction chamber 26. The semiconductor discs 27 loaded onto the cantilever 19 are then inserted into the reaction chamer 26 until they are in the position shown in FIG. 1. This produces a vacuum-tight seal with the conical nipple 17. The undefined atmosphere which is still present at this point in time in the process chamber 26 is then extracted by means of a "soft-pump-down-step" and replaced by a defined process as atmosphere by injecting this defined gas mixture through the process gas feeder 16. This exchange can be repeated a number of times if required.

Subsequently the adjustable heating element 20 is switched on and together with the heating cassette 9 and the heating element 28 a uniform temperature distribution is produced in the process chamber. At the same time the inert gas rinsing is switched over to lesser amounts. The actual process cycle of gate oxidation can now take place with its intermediate steps. On completion of the gale oxidation the heating element 20 is at first switched off, the heating cassette 9 and the heating element 28 reduced to a value below 400° C. and the inert gas rinsing set to a high rate of flow. After a short waiting time, dependent on the process, the cantilever system 18-25 with the semiconductor discs can be removed and the process started anew.

I claim:

1. An apparatus for the thermal treatment of semiconductor materials in diffusion furnaces, in particular for low, middle and high temperature treatment, including a double-walled process tube open on the loading side with a liquid rinsing system provided in an annulus formed between the tube walls, a cantilever construction for loading the semiconductor discs to be treated into the process tube and a process gas feeder at the rear end of the process tube with disposal of this gas on the loading side, comprising an isothermic process chamber (26), which is completely surrounded by heating elements (9, 20, 28), said heating elements including a heating cassette (9) which cylindrically surrounds an outer tube (1) and a heating element on a loading side (20) integrated into the cantilever system (18 to 25) and is moveable, and a second heating element (28) arranged in a first rear, stationary vestibule block (7), said vestibule block (7) housing both a gas drainage connection piece (3) and an insert gas rinsing system (10) with a crown of gas inlet nozzles (11) arranged in the space between the inner process tube (1) and the outer tube (2), and a second vestibule block (8) equipped with the moveable cantilever system (18–25) and a rinsing gas system (10–12) with a crown of outlet nozzles (12).

2. An apparatus in accordance with claim 1, moveable heating element (20) is integrated into the cantilever system (18–25).

3. An apparatus in accordance with claim 1, wherein the further comprising an adjustable gas rinsing system located in the space between both tubes (1) and (2).

4. An apparatus in accordance with claim 1, wherein the process tube (1) is widened in the area of said second vestibule block (8) and narrowed in the area of said first vestibule block (7) to a gas outlet connection piece (3) which penetrates said first vestibule block (7).

5. An apparatus in accordance with claim 1, wherein the process tube (1) is widened at its open end for a length of at least 100 mm and narrowed at its rear end approximately 100 mm after a used flat zone section directly to the dimension of the gas outlet connection piece (3).

6. An apparatus in accordance with claim 1, further comprising said cantilever system including a quartz connection piece and a process gas feeder (16) on the loading side arranged laterally in a circular groove between the widened end of the process tube (1) and said quartz connection piece (18) and its outlet openings pointing obliquely into the circular groove.

7. An apparatus in accordance with claim 1, wherein said heating element on said loading side is pot-shaped (20) and in which the end of the cantilever system (18–25) faces the process chamber (26), whereby a part of the heating element adjoins the circular groove between the process tube (1) and the quartz connection piece (18), and the front part of said second heating system element (28) are opposite one another.

8. An apparatus in accordance with claim 1, wherein said cantilever system is a plug-in type cantilever system (18–25) in which a pot-shaped heating installation (20) is integrated.

9. An apparatus in accordance with claim 1, further comprising an exhaust system (4,6) with a gas feeder.

10. An apparatus in accordance with claim 9, wherein said exhaust system comprises a gas outlet connection piece (3), a 3-way valve (4) and a pump (5).

11. An apparatus in accordance with claim 1, further comprising different paddles (19, 35, 36) adapted to be form-fit inserted into said cantilever system (18–25).

* * * * *